(12) United States Patent
Jou et al.

(10) Patent No.: US 7,453,200 B2
(45) Date of Patent: Nov. 18, 2008

(54) WHITE-LIGHT ORGANIC LIGHT-EMITTING DIODE (OLED) AND ITS FABRICATION METHOD

(75) Inventors: Jwo-Huei Jou, Hsinchu (TW); Ming-Chen Sun, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 18 days.

(21) Appl. No.: 11/398,968

(22) Filed: Apr. 7, 2006

(65) Prior Publication Data
US 2007/0236136 A1    Oct. 11, 2007

(51) Int. Cl.
*H01L 51/54*    (2006.01)
*H05B 33/14*    (2006.01)

(52) U.S. Cl. .................. 313/504; 313/506; 428/690; 428/917

(58) Field of Classification Search ......... 313/500–512; 428/690, 917
See application file for complete search history.

(56) References Cited

U.S. PATENT DOCUMENTS

| 2003/0175553 A1* | 9/2003 | Thompson et al. | 428/690 |
| 2004/0104394 A1* | 6/2004 | Lin et al. | 257/79 |
| 2006/0232194 A1* | 10/2006 | Tung et al. | 313/504 |
| 2006/0246315 A1* | 11/2006 | Begley et al. | 428/690 |

* cited by examiner

*Primary Examiner*—Bao Q Truong
(74) *Attorney, Agent, or Firm*—Egbert Law Offices

(57) ABSTRACT

The present invention has provided a method for fabricating a white-light organic light-emitting diode (OLED) which allows single emitting layers and micro-molecular materials to be formed on the substrate. The white-light OLED includes a white organic emitting layer, a first electrode nearby the first surface of white organic emitting layer, and a second electrode nearby the second surface of white organic emitting layer. The white organic emitting layer is formed by mixing organic light-emitting dyes of white light combination with a micro-molecular substrate via a solution manufacturing process.

10 Claims, 15 Drawing Sheets

11. Accompanying Drawing

Table 1

| Example: | Concentration of organic light-emitting dyes | | | Drive voltage (V) | Maximum efficiency (cd/A)(lm/W) | Maximum brightness (cd/m2) | CIE color coordinate (in the case of 7V) | Remarks |
|---|---|---|---|---|---|---|---|---|
| | (Blue) Flrpic | (Green) :Ir(ppy)$_3$ | (Red) :BtpIr(acac) | | | | | |
| 1 | 12 | 0.4 | 0.35 | 6.5 | 2.6/1.3 | 3060 | (0.43,0.35) | Reference data |
| 2 | 12 | 0.4 | 0.35 | 4 | 3.5/1.7 | 4400 | (0.38,0.36) | Present invention |
| 3 | 12 | 0.4 | 0.35 | 4 | 3.9/1.8 | 5070 | (0.37,0.38) | Present invention |
| 4 | 12 | 0.4 | 0.35 | 4.25 | 7.9/3.7 | 6870 | (0.35,0.38) | Present invention |
| 5 | 12 | 0.4 | 0.35 | 4 | 11.3/5.6 | 15200 | (0.34,0.39) | Present invention |
| 6 | 12 | 0.2 | 0.2 | 4 | 9.3/4.2 | 12600 | (0.30,0.38) | Present invention |
| 7 | 12 | 0.2 | 0.35 | 4 | 8.8/4.2 | 12500 | (0.35,0.37) | Present invention |
| 8 | 12 | 0.2 | 0.5 | 4.25 | 8.4/3.8 | 8700 | (0.39,0.36) | Present invention |
| 9 | 12 | 0.0 | 0.35 | 4.75 | 6.6/2.9 | 9600 | (0.34,0.35) | Present invention |
| 10 | 12 | 0.3 | 0.35 | 4 | 11/4.7 | 13100 | (0.35,0.38) | Present invention |
| 11 | 12 | 0.4 | 0.35 | 4.25 | 11.8/5.7 | 13840 | (0.34,0.40) | Present invention |
| 12 | 12 | 0.5 | 0.35 | 4.25 | 13.7/6.4 | 15250 | (0.35,041) | Present invention |
| 13 | 12 | 0.6 | 0.35 | 4 | 13.9/6.3 | 15410 | (0.35,0.43) | Present invention |
| 14 | 12 | 0.7 | 0.35 | 4.25 | 14.7/7.1 | 16220 | (0.35,0.45) | Present invention |
| 15 | 10 | 0.4 | 0.35 | 4.5 | 11.5/4.5 | 13470 | (0.33,040) | Present invention |
| 16 | 12 | 0.4 | 0.35 | 4.5 | 11.8/5.1 | 13820 | (0.34,0.39) | Present invention |
| 17 | 14 | 0.4 | 0.35 | 4.75 | 12.7/5.3 | 12970 | (0.34,0.38) | Present invention |
| 18 | 16 | 0.4 | 0.35 | 5 | 13.1/5.5 | 13440 | (0.34,040) | Present invention |
| 19 | 12 | 0.2 | 0.35 | 4.5 | 2.8/1.1 | 5250 | (0.35,0.41) | Present invention |

+: Comparing the efficiency of OLED with the same concentration of red, green and blue dyes, but fabricated in different batches.

FIG. 21

WHITE-LIGHT ORGANIC LIGHT-EMITTING DIODE (OLED) AND ITS FABRICATION METHOD

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to a method for fabricating a white-light organic light-emitting diode (OLED), and more particularly to a method for fabricating a white-light OLED which allows single emitting layers and micromolecular materials to be formed on its substrate with an improved performance and simpler manufacturing process.

BACKGROUND OF THE INVENTION

The emitting color of the Organic Light-Emitting Diode (OLED) depends upon organic emitting materials, or organic light-emitting dyes on the substrate mixed with the required light color. Referring to FIG. 1, an OLED 100 of related art comprises a substrate 110, an anode 120, a hole transport layer 140, an organic light-emitting layer 150, an electron transport layer 170 and a cathode 190. When a forward bias voltage is charged on this structure, an electric hole 141 and electron 171 will be separately injected from the cathode and anode into a hole transport layer 140 and Electron transport layer 170, and then transmitted to the organic light-emitting layer 150, where they are overlapped for emitting light.

An OLED is typically categorized into micro-molecular and high-molecular OLED according to the types of substrate made of organic light emitting materials.

Micro-molecular substrate OLED is generally fabricated byway of vacuum evaporation, such that micro-molecular materials have a better film forming quality. However, the corresponding manufacturing equipment is limited to applications on small-sized panels due to a higher investment costs. Conversely, high-molecular substrate OLED is fabricated through a solution manufacturing process, which combines a coating or ink-jet method without needing large-size vacuum devices. Thus, the manufacturing process is significantly simplified with lower investment costs. In addition, highly attractive large-size displays or lighting devices are able to be developed thanks to smaller dimensions of substrate and few limitations on screen printing or ink-jet printing.

The light-emitting layer of a white-light OLED is divided into single-layer and multi-layer.

For multi-layer white-light OLED, the carrier's overlapping area will displace with the change of voltage, and lead to the deviation of light color, owing to the fact that the transfer rate of electron and electric hole differs from each other in different layers, and also varies with the changing voltage.

For single-layer white-light OLED, the white emitting layer is formed by a vacuum evaporation method, whereby micro-molecular orange and blue dyes, or red, green and blue dyes are mixed synchronously into micro-molecular substrate materials. Due to a smaller portion of dyes mixed into white-light OLED in relation to micro-molecular substrate materials, it makes it difficult to jointly control the evaporation percentage, and the components of dyes are easy to change, thus resulting in poor color rendering and lower performance. While generating white color of high color rendering with three wavelengths or more, it becomes more difficult to synchronously control three or above dye molecules in addition to substrate materials, leading to poorer color rendering and performance in the applications.

Alternatively, the white emitting layer of the single-layer white-light OLED is formed by mixing red, green and blue dyes into high-molecular substrate materials via a solution manufacturing process. Nonetheless, it has poorer brightness and emitting efficiency and a shorter lifecycle than micromolecule. In addition, a lower level of color reliability and purity will encounter difficulty in the application of a white-color OLED.

BRIEF SUMMARY OF THE INVENTION

The objective of the present invention is to provide a method for fabricating a white-light OLED, which allows single emitting layers and micro-molecular materials to be formed on its substrate with an improved performance and simpler manufacturing process. The organic light-emitting layer of white-light OLED is formed by mixing organic light-emitting dyes of white light combinations into micro-molecular substrate materials via a solution manufacturing process.

The white-light OLED is comprised of an organic light-emitting layer, which is formed by mixing organic light-emitting dyes of white light combinations into a single or several emitting or non-emitting micro-molecular substrate via a solution manufacturing process. The organic light-emitting dyes of white light combinations comprise red, green and blue organic light-emitting dyes, or yellow and blue organic light-emitting dyes, or any other white organic emitting dyes combined with these micro-molecular substrate materials.

The white-light OLED also includes a first electrode, or hole injection layer or hole transport layer nearby the first surface of organic light-emitting layer, and a second electrode, or hole blocking layer or electron transport layer or electron injection layer nearby the second surface of organic light-emitting layer.

The fabrication method of white-light OLED is primarily presented by a solution manufacturing process for organic light-emitting layer. The method includes preparation of a solution, addition of organic solvents, covering, and curing.

I. Preparation of solution: The solution of an organic light-emitting layer is prepared by mixing a single or several emitting or non-emitting micromolecular substrate with organic light-emitting dyes of white light combinations. Of which, organic light-emitting dyes of white light combination comprise red, green and blue organic light-emitting dyes, or yellow and blue organic light-emitting dyes or any other white organic emitting dyes combined with these micromolecular substrate materials.

II. Addition of organic solvents: Volatile organic solvents are added and mixed into above-described white organic emitting solutions.

III. Covering: It aims to reduce efficiently the volatilizing rate of organic solvents in an environment filled with inert gas. By means of coating, ink-jet printing, screen printing and spin coating, the solution of white organic emitting material can be covered layer-by-layer onto the processing material.

Of which, the processing material is the first electrode, or hole injection layer or hole transport layer nearby the first surface of white organic emitting layer; or the second electrode, or hole blocking layer or electron transport layer or electron injection layer nearby the second surface of white organic emitting layer.

IV. Curing: After volatile organic solvent is volatilized, the solution of organic emitting material is cured into white organic emitting layer

BRIEF DESCRIPTION OF THE SEVERAL VIEWS OF THE DRAWINGS

The features and the advantages of the present invention will be more readily understood upon a thoughtful deliberation of the following detailed description of a preferred embodiment of the present invention with reference to the accompanying drawings.

FIG. 21 shows a graph illustration of the data list of white-light OLED in accordance with example 1-19 covering drive voltage, maximum efficiency, maximum brightness and CIE color coordinate.

DETAILED DESCRIPTION OF THE INVENTION

The organic light-emitting layer of the present invention is formed via a solution manufacturing process from a single or several emitting or non-emitting molecular substrate and red, green and blue organic light-emitting dyes, or yellow and blue organic light-emitting dyes, or any other white organic emitting dyes combined with molecular substrate. The applicable red, green and blue organic light-emitting dyes include but not limited to: red dyes such as: DCM, DCM2, DCJT, DCJTB, PtOEP, Eu(DBM)3(Phen), Rubrene, Btp2Ir(acac), Ir(MDQ)2(acac), Ir(DBQ)2(acac) and PQIr as well as their derivates; green dyes such as: Coumarin 6, C545T, DMQA, Ir(mppy)3 and Ir(ppy)3 as well as their derivatives; blue dyes such as: BCzVBi, BCzVB, TBPe, Perylene, DPAVB, DPAVBi, DSA, Firpic and FIr6 as well as their derivatives. The substrate materials comprise electron transmission, hole transmission and hole blocking materials or other materials of proper energy gap that can transfer the energy generated from electron-hole overlapping to the light-emitting dyes. And, the commonly used substrate materials include but not limited to: CBP, TAZ, TCTA, mCP, BAlq3, BCP, PFO, DPVBi, BNA, TBAB, AND and TPBI as well as derivatives of the foregoing materials.

The substrate and anode must be a transparent material for light conduction. Moreover, the substrate is a glass or plastic substrate, of which plastic substrate OLED features flexibility. A commonly used anode is formed by light-transmission and a conductive metal oxide. Indium-tin-oxide(ITO) and indium zinc oxide (IZO) are widely applied as the materials of anode thanks to outstanding transparency and conductivity. Alternatively, other materials are made available, such as: zinc oxide with aluminum or indium, magnesia indium and nickel tungsten oxide.

A hole injection layer is helpful to hole injection and improvement of subsequent formation of organic layer. The materials suitable for hole injection layer include but not limited to: PEDOT, PEDOT:PSS, CuPc, TCTA, T-NATA, m-MTDATA and TiOPC as well as derivatives of foregoing materials.

An electron transport layer for electron transport includes but not limited to: CBP, TAZ, BCP, Alq3 and PBD as well as derivatives of foregoing materials. An electron injection layer for electron injection is a low-work-function metal or metal-salt compound, and includes but not limited to: LiF, CsF, NaCl, KCl, Li2O and MgF2.

In principle, a cathode of the present invention is represented by any metal material, but applicable material of the cathode must be a low-work-function metal (<4.0 eV) in support of electronic metal material and formation/injection of the electron. It includes but is not limited to: Ca, Ag, Li, Mg, Al or combinations of foregoing metals.

Figure 1:
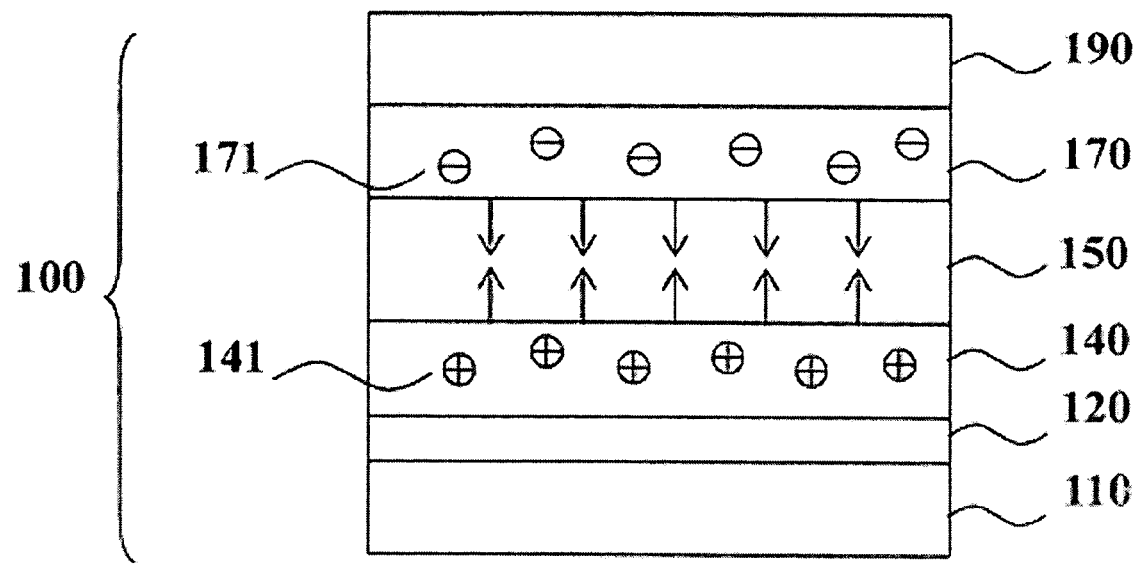
FIG. 1 shows a schematic view of a typical organic light-emitting diode 100.
Figure 2:
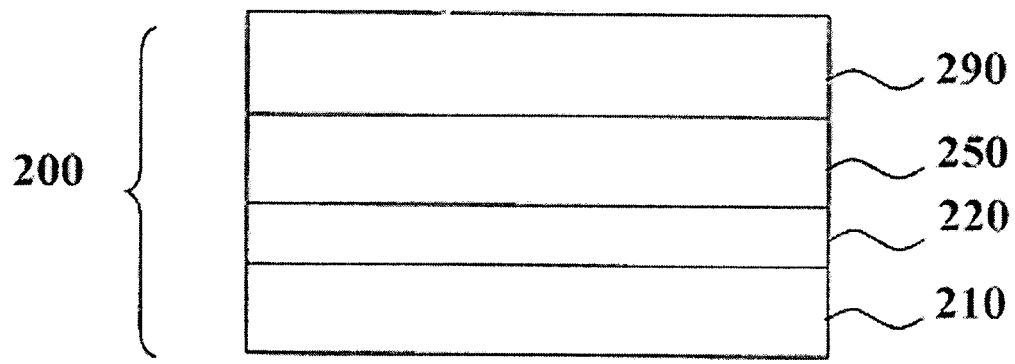
FIG. 2 shows a schematic view of the white-light organic light-emitting diode 200 of the present invention.

FIG. 2 illustrates a preferred embodiment of white-light OLED 200. It generally comprises a substrate 210, a first electrode 220, a white organic emitting layer 250 and a second electrode 290. Of which, white organic emitting layer 250 is formed via a solution manufacturing process from a single or several emitting or non-emitting molecular substrate and red, green and blue organic light-emitting dyes, or yellow and blue organic light-emitting dyes, or any other white organic emitting dyes combined with molecular substrate. The first electrode 220 is either a cathode or an anode. In the case of a cathode, substrate 210 is a transparent or non-transparent material, while the second electrode 290 must be a transparent anode. If the first electrode 220 is an anode, substrate 210 must be a transparent material, and the second electrode 290 is a cathode. However, the first and second electrode of white-light OLED is separately set as anode and cathode in order to provide a further understanding of the invention.

Figure 3:
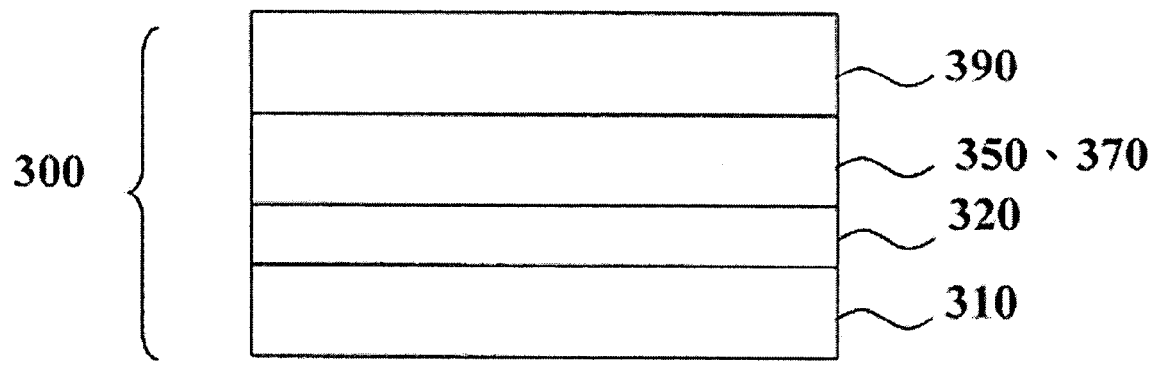
FIG. 3 shows a schematic view of the white-light organic light-emitting diode 300 of the present invention.

FIG. 3 illustrates a preferred embodiment of white-light OLED 300. As compared to white-light OLED 200, white-light OLED 300 mixes electron transport material 370 into a white organic emitting layer 350. White-light OLED 300 comprises a substrate 310, a first electrode 320, a white organic emitting layer 350 and a second electrode 390.

Figure 4:
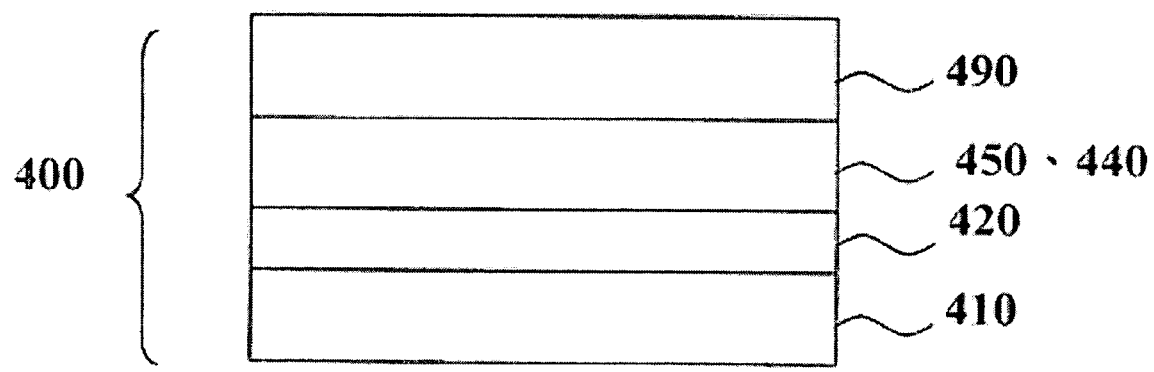
FIG. 4 shows a schematic view of the white-light organic light-emitting diode 400 of the present invention.

FIG. 4 illustrates a preferred embodiment of white-light OLED 400. As compared to white-light OLED 200, white-light OLED 400 mixes hole transport material 440 into a white organic emitting layer 450. White-light OLED 400 comprises a substrate 410, a first electrode 420, a white organic emitting layer 450 and a second electrode 490.

Figure 5:
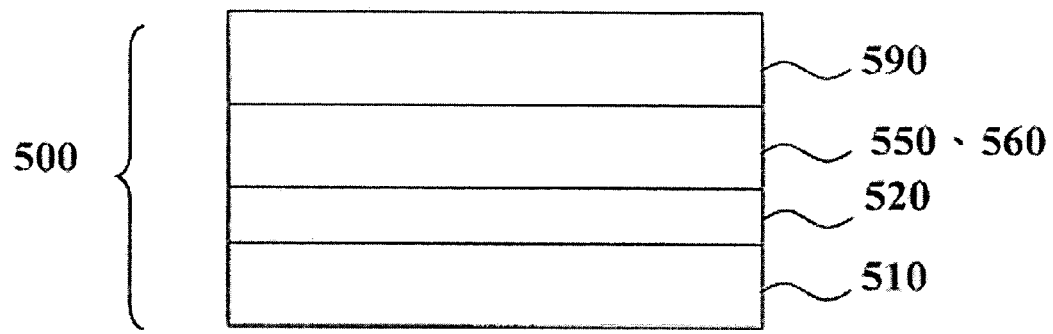
FIG. 5 shows a schematic view of the white-light organic light-emitting diode 500 of the present invention.

FIG. 5 illustrates a preferred embodiment of white-light OLED 500. As compared to white-light OLED 200, white-light OLED 500 mixes hole blocking material 560 into a white organic emitting layer 550. White-light OLED 500 comprises a substrate 510, a first electrode 520, a white organic emitting layer 550 and a second electrode 590.

Figure 6:
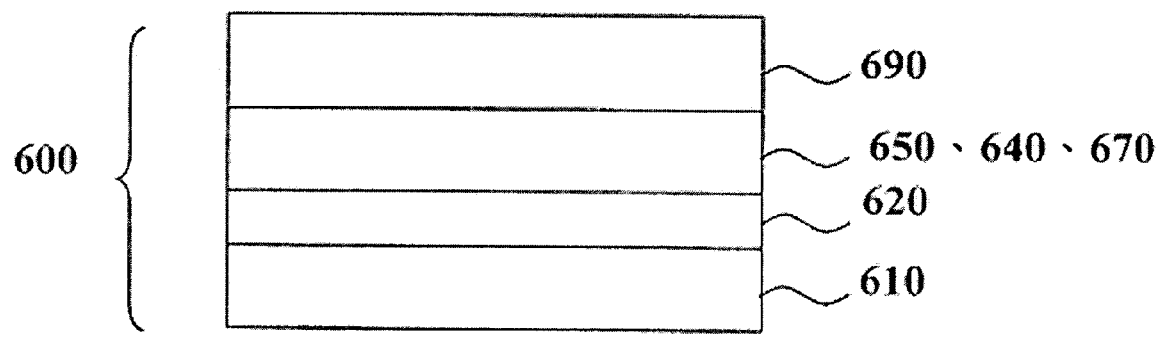
FIG. 6 shows a schematic view of the white-light organic light-emitting diode 600 of the present invention.

FIG. 6 illustrates a preferred embodiment of white-light OLED 600. As compared to white-light OLED 200, white-light OLED 600 mixes hole transport material 640 and electron transport material 670 into a white organic emitting layer 650. White-light OLED 600 comprises a substrate 610, a first electrode 620, a white organic emitting layer 650 and a second electrode 690.

Figure 7:
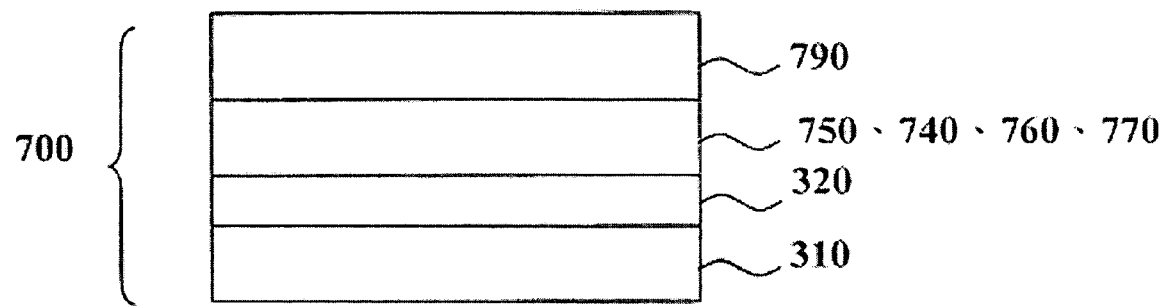
FIG. 7 shows a schematic view of the white-light organic light-emitting diode 700 of the present invention.

FIG. 7 illustrates a preferred embodiment of white-light OLED 700. As compared to white-light OLED 200, white-light OLED 700 mixes hole transport material 740, electron transport material 770 and hole blocking layer 760 into a white organic emitting layer 750. White-light OLED 700 comprises a substrate 710, a first electrode 720, a white organic emitting layer 750 and a second electrode 790.

Figure 8:
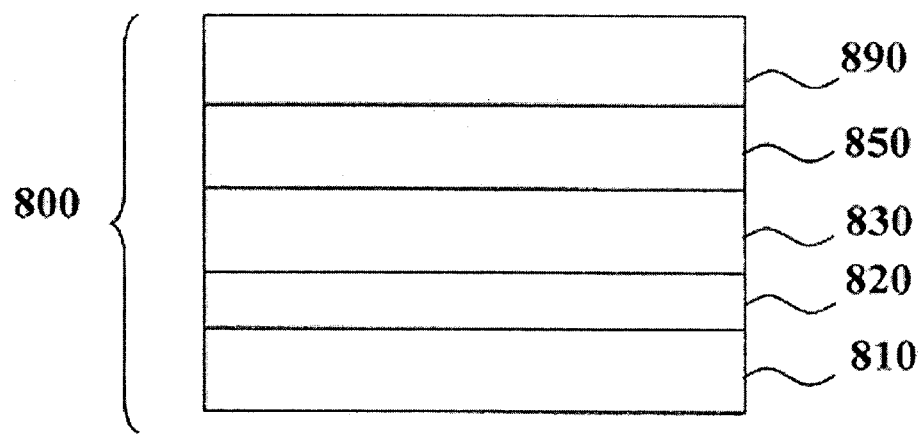
FIG. 8 shows a schematic view of the white-light organic light-emitting diode 800 of the present invention.

FIG. 8 illustrates a preferred embodiment of white-light OLED 800. As compared to white-light OLED 200-700, white-light OLED 800 adds a hole injection layer 830 between a first electrode 820 and white organic emitting layer 850. White-light OLED 800 comprises a substrate 810, a first electrode 820, a hole injection layer 830, a white organic emitting layer 850 and a second electrode 890.

Figure 9:
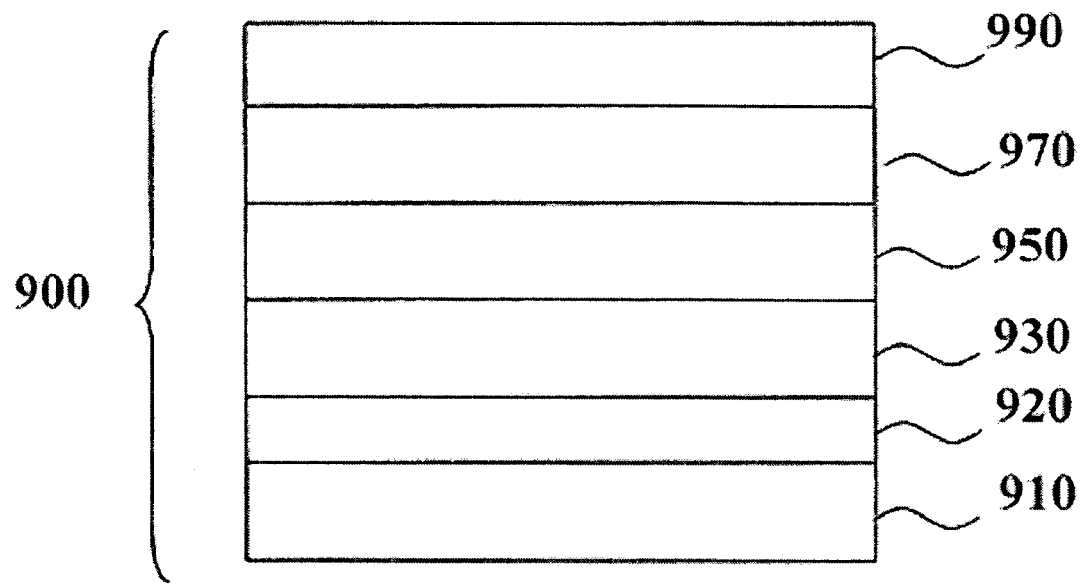
FIG. 9 shows a schematic view of the white-light organic light-emitting diode 900 of the present invention.

FIG. 9 illustrates a preferred embodiment of white-light OLED 900. As compared to white-light OLED 800, white-light OLED 900 adds an electron transport layer 970 between white organic emitting layer 950 and second electrode 990. White-light OLED 900 comprises a substrate 910, a first electrode 920, a hole injection layer 930, a white organic emitting layer 950, an electron transport layer 970 and a second electrode 990.

Figure 10:
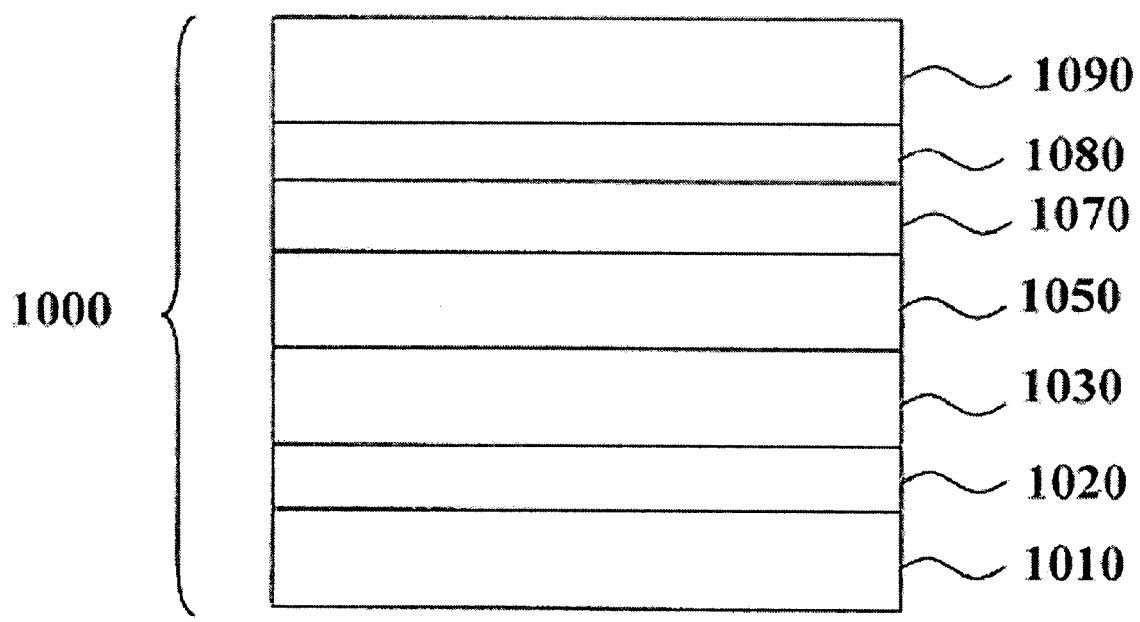
FIG. 10 shows a schematic view of the white-light organic light-emitting diode 1000 of the present invention.

FIG. 10 illustrates a preferred embodiment of white-light OLED 1000. As compared to white-light OLED 900, white-light OLED 1000 adds an electron injection layer 1080 between electron transport layer 1070 and second electrode 1090. White-light OLED 1000 comprises a substrate 1010, a first electrode 1020, a hole injection layer 1030, a white organic emitting layer 1050, an electron transport layer 1070, an electron injection layer 1080 and a second electrode 1090.

Figure 11:
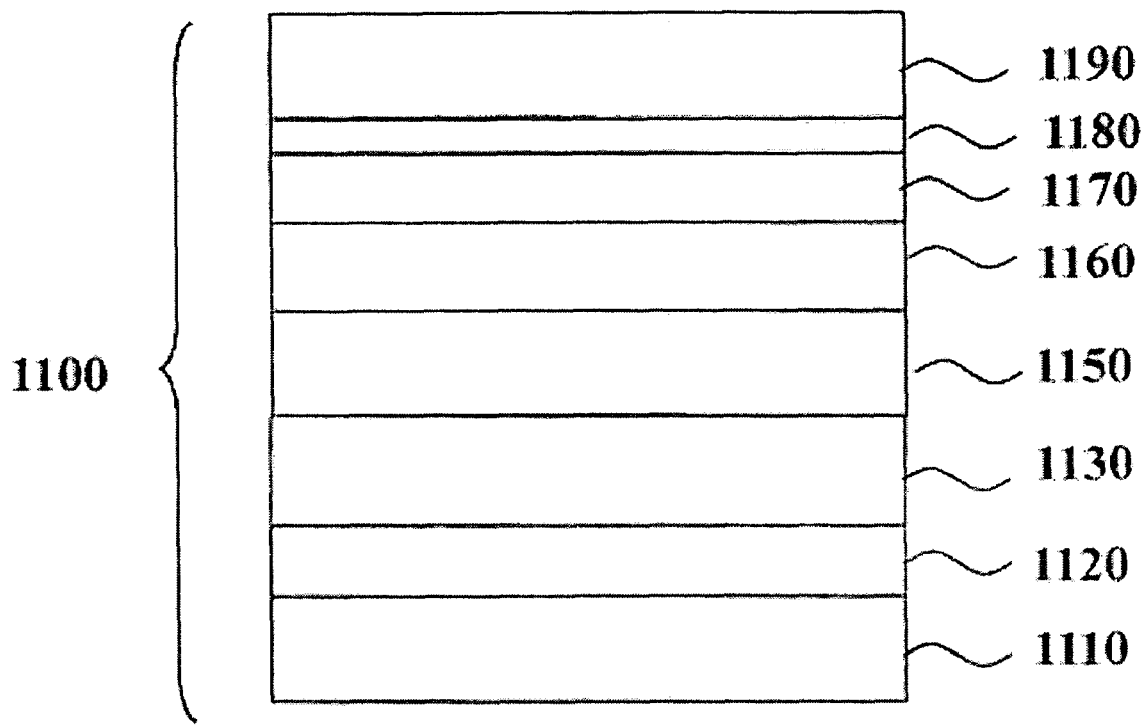
FIG. 11 shows a schematic view of the white-light organic light-emitting diode 1100 of the present invention.

FIG. 11 illustrates a preferred embodiment of white-light OLED 1100. As compared to white-light OLED 1000, white-light OLED 1100 adds a hole blocking layer 1160 between a white organic emitting layer 1150 and electron transport layer 1170. White-light OLED 1100 comprises a substrate 1110, a first electrode 1120, a hole injection layer 1130, a white organic emitting layer 1150, a hole blocking layer 1160, an electron transport layer 1170, an electron injection layer 1180 and a second electrode 1190.

Figure 12:
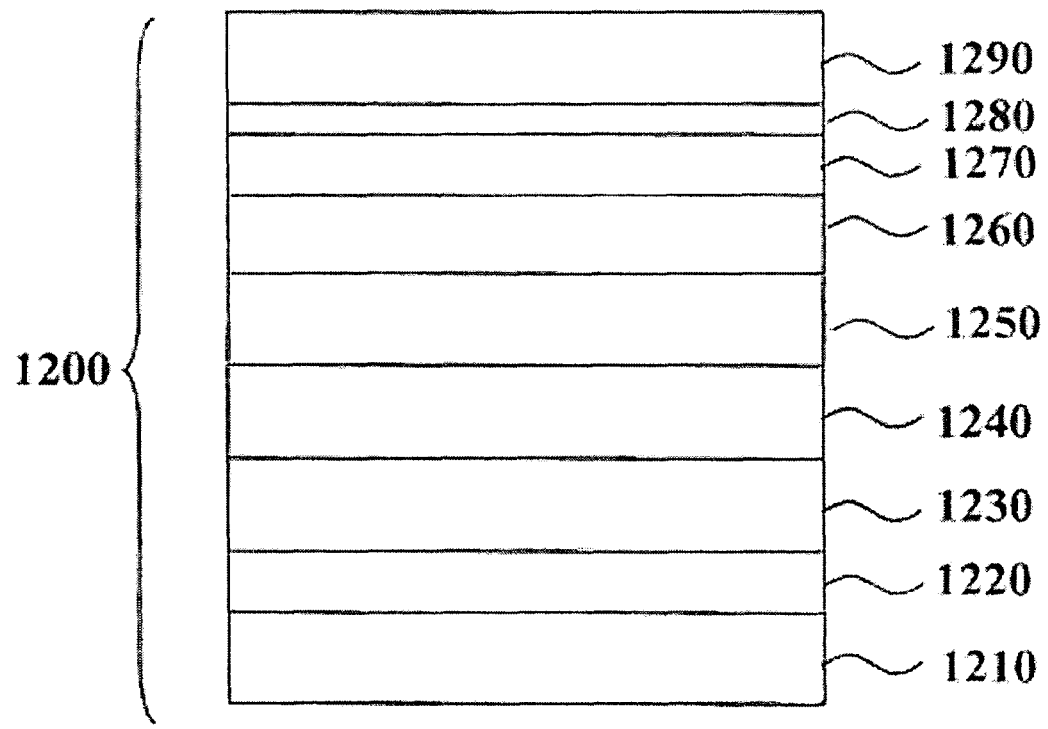
FIG. 12 shows a schematic view of the white-light organic light-emitting diode 1200 of the present invention.

FIG. 12 illustrates a preferred embodiment of white-light OLED 1200. As compared to white-light OLED 1100, white-light OLED 1200 adds a hole transport layer 1240 between hole injection layer 1230 and white organic emitting layer 1250. White-light OLED 1200 comprises a substrate 1210, a first electrode 1220, a hole injection layer 1230, a hole transport layer 1240, a white organic emitting layer 1250, a hole blocking layer 1260, an electron transport layer 1270, an electron injection layer 1280 and a second electrode 1290.

The features and the advantages of the present invention will be more readily understood upon a thoughtful deliberation of the following detailed description of a preferred embodiment of the present invention with reference to the accompanying drawing.

EXAMPLE 1

Example 1 illustrates a white-light OLED made of high-molecular substrate according to the related arts. Referring to FIG. 11, this device comprises a substrate 1110 with anode 1120 formed on substrate 1110; a hole injection layer 1130 formed on anode 1120; a white organic emitting layer 1150 formed on hole injection layer 1130; a hole blocking layer 1160 formed on white organic emitting layer 1150; an electron transport layer 1170 formed on hole blocking layer 1160; an electron injection layer 1180 formed on hole blocking layer 1170; and a cathode 1190 formed on electron injection layer 1180.

As described above, white-light OLED is fabricated by the following steps: allowing hole injection material PEDOT:PSS to be coated onto pre-cleaned ITO transparent conductive glass by a spin coater, and thus forming a 40-nano hole injection layer. In the preparation of a white organic emitting layer, the red dyes Btp2Ir(acac), green dyes Ir(ppy)3 and blue dyes Firpic are uniformly mixed into high-molecular PVK substrate by the following ways. Firstly, 15 mg/mL and 1 mg/mL substrate molecule and light dyes are allowed to be dissolved into toluene solvent. According to the required percentage of concentration, the blue, green and red dyes are mixed into the substrate molecular solution, forming a uniformly mixed solution. The concentration of blue light accounts for 0.01-30 wt % of the substrate, and the concentration of green light and red light for 0.01-10 wt %. A few combinations of concentration are listed in the method to implement white-light OLED of the present invention. In Example 1, the concentration of blue, green and red dyes is 12 wt %, 0.4 wt % and 0.35 wt %, respectively.

In the preparation of a white organic emitting layer, the solution of white organic emitting material is applied onto ITO transparent conductive glass of above-specified hole injection layer PEDOT:PSS by way of spin coating. In this way, the above-specified mixed solution is applied onto indium-tin oxide transparent conductive glass of prepared hole injection layer in a nitrogen-filled glove box. Then, maintaining a 20-second spin coating of 2,500 rpm, the white organic emitting material is applied onto a hole transport layer using a spin coater.

The components of coated white organic emitting layer are placed in a 10-3 Torr vacuum drying oven, wherein a white organic emitting layer is formed after 1-hour 120° C. solvent-removal heat treatment. Then, a 15-nano hole blocking layer BAlq3, 20-nano electron transport layer Alq3, 0.5-nano electron injection layer Lif and 120-nano cathode aluminum are allowed to be galvanized onto above-specified white organic emitting layer by way of vacuum evaporation under 10-5 Torr vacuum pressure, thus forming a white-light OLED of Example 1. PR650 spectrometer is used to measure the organic light-emitting feature.

FIG. 21 illustrates a white-light OLED of Preferred Embodiment 1, wherein the drive voltage (brightness>1 cd/m2), maximum efficient and maximum brightness is 6.5 (V), 2.6(cd/A) and 3,060(cd/m2), respectively.

EXAMPLES 2-5

As compared to high-molecular substrate of Example 1, the white-light OLED of Examples 2-5 selects micro-molecular material as its substrate, with the method of preparation described below.

Firstly, 15 mg/mL and 1 mg/mL substrate molecule and light dyes are allowed to be dissolved into toluene solvent, and uniformly stirred for 24-hour by a stirrer. In preparation of the solution required for white emitting layer, the uniformly dissolved light dyes are mixed into the substrate molecular solution according to the required percentage of concentration, thus forming a uniformly mixed solution. In the Examples 2-5 of the present invention, the substrate molecular materials comprise micro-molecular material mCP, TCTA, TAZ and CBP; the organic light-emitting dyes include FIrpic(blue), Ir(ppy)3 (green) and Btp2Ir(acac)(red), with a concentration of 12 wt %, 0.4 wt % and 0.35 wt %, respectively.

In the present invention, ITO(indium-tin oxide) transparent conductive glass serves as an anode substrate, with the cleaning steps as follows. Firstly, ITO glass is allowed to be soaked into proportional water and cleaning agent, and vibrated 20-minute under ultrasound. Then, ITO glass is placed sequentially into de-ionized water, acetone and isopropanol, and dried by nitrogen after being vibrated 20-minute under ultrasound.

White-light OLED is fabricated by the following steps. In a nitrogen-filled glove box, hole injection material PEDOT:PSS is allowed to be coated onto pre-cleaned ITO transparent conductive glass by a spin coater in 4,000 rpm, thus forming a 40-nano hole injection layer. Then, maintaining a 20-second spin coating of 2,500 rpm, the uniformly mixed white organic emitting material is applied onto a hole transport layer.

Finally, the components of coated white organic emitting layer are placed in a 10-3 Torr vacuum drying oven, wherein a white organic emitting layer is formed after 1-hour 120° C. solvent-removal heat treatment. Then, 15-nano hole blocking layer BAlq3,20-nano electron transport layer Alq3, 0.5-nano electron injection layer Lif and 120-nano cathode aluminum are allowed to be galvanized onto the above-specified white organic emitting layer by way of vacuum evaporation under 10-5 Torr vacuum pressure, thus forming a white-light OLED of Example 1. PR650 spectrometer is used to measure the organic light-emitting feature.

Figure 13:
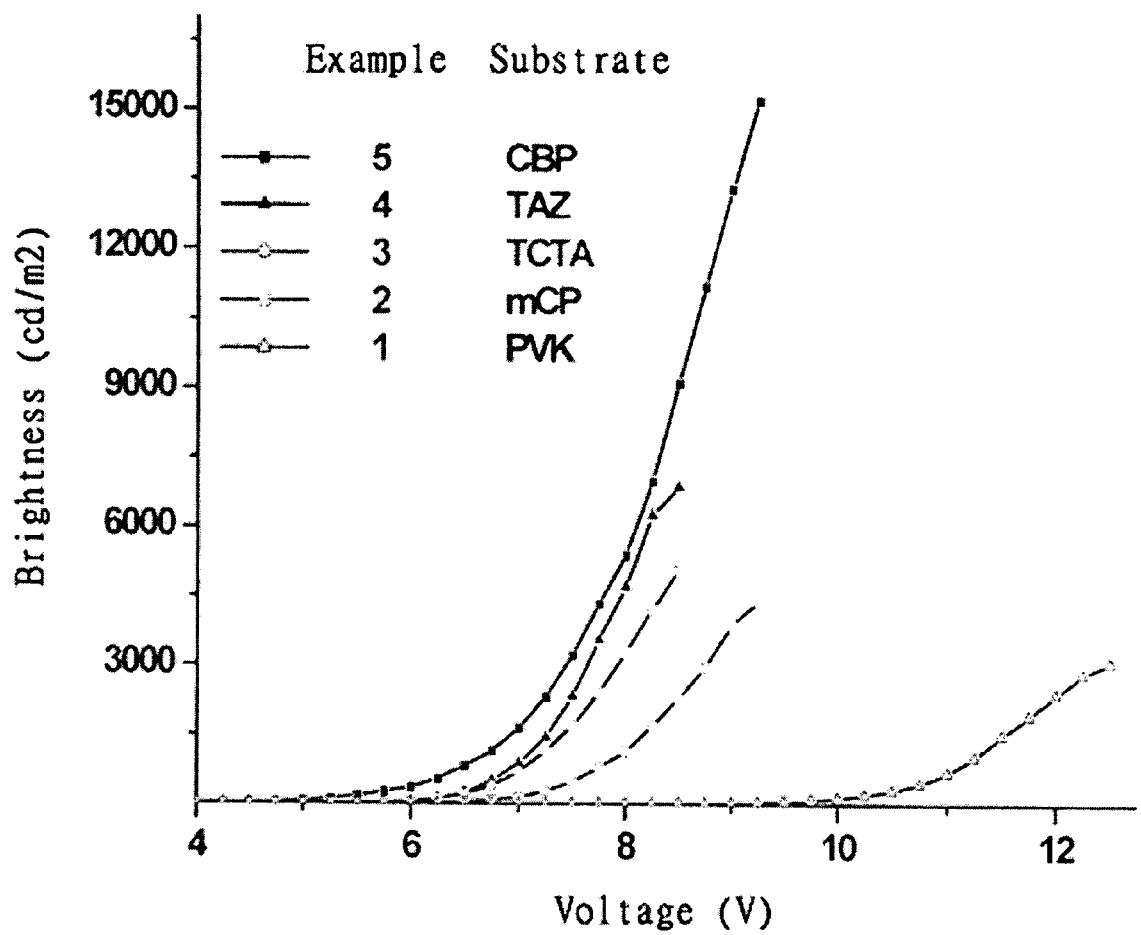
FIG. 13 shows a graphic illustration of the brightness-voltage characteristics of the white-light OLED in accordance with example 1 and example 2-5 of the present invention.

FIG. 13 illustrates a comparative brightness-voltage characteristic diagram of a white-light OLED of Example 1 and Examples 2-5. On a comparative basis, high-molecular materials of Example 1 and Examples 2-5 comprise high-molecular PVK and micro-molecular mCP, TCTA, TAZ, CBP. The concentration of organic light-emitting dyes FIrpic, Ir(ppy)3 and Btp2Ir(acac) is set as 12 wt %, 0.4 wt % and 0.35 wt %, respectively. As compared to high-molecular PVK in Example 1, the white OLED of micro-molecular substrate in Examples 2-5 ensures a better brightness. And, it presents optimal brightness if CBP serves as a substrate. As listed in Table 1, when micro-molecular mCP, TCTA, TAZ and CBP serve as a substrate of Examples 2-5, the maximum brightness of white-light OLED will increase up to 4,400, 5,070, 6,870 and 15,200(cd/m2) as compared to 3,060(cd/m2) of high-molecular PVK in Example 1. The maximum current efficiency will increase from 2.6(cd/A) to 3.5, 3.9, 7.9 and 11.3(cd/A). The drive voltage of white-light OLED will decrease to 4 (V) from 6.5 (V) of high-molecular PVK. The aforesaid results show that, if high-molecular substrate is replaced by micro-molecular substrate, it shall be possible to improve efficiently the emitting efficiency of white-light OLED.

EXAMPLES 6-18

The white-light OLED of Examples 6-18 has the same structure and preparation method as that of Example 5, apart from different concentrations of mixed red, green and blue dyes.

Referring to Example 6-8 of FIG. 21, when the concentration of FIrpic and Ir(ppy)3 in CBP is fixed at 12 wt % and 0.35 wt %, and the concentration of Btp2Ir(acac) increases from 0.2 wt % to 0.5 wt %, the maximum current efficiency and energy efficiency will decrease to 8.4(cd/A) and 3.8(cd/W) from 9.3(cd/A) and 4.2(cd/W), separately; while the maximum brightness will decrease from 12,600(cd/m2) to 8,700 (cd/m2). This phenomenon is owing to the fact that Btp2Ir (acac) has a poorer emitting efficiency in relation to FIrpic and Ir(ppy)3, and more Btp2Ir(acac) molecules are involved in organic light-emitting with the increasing concentration of red dye Btp2Ir(acac). This reduces the probability of energy transfer to FIrpic and Ir(ppy)3 of higher emitting efficiency, thus leading to the decline of emitting efficiency of white-light OLED.

Referring to Example 7, 9-14 of FIG. 21, when the concentration of FIrpic and Btp2Ir(acac) in CBP is fixed at 12 wt % and 0.35 wt %, and the concentration of Ir(ppy)3 increases from 0.2 wt % to 0.7 wt %, the maximum current efficiency and energy efficiency will increase to 14.7(cd/A) and 7.1(cd/W) from 8.8(cd/A) and 4.2(cd/W), separately; while the maximum brightness will increase from 12,500(cd/m2) to 16,200(cd/m2). This phenomenon is owing to the fact that Ir(ppy)3 has a higher emitting efficiency in relation to FIrpic and Btp2Ir(acac). Thus, light-emitting efficiency of white-light OLED will be improved with the increasing concentration of Ir(ppy)3.

Referring to Example 15-18 of FIG. 21, when the concentration of Ir(ppy)3 and Btp2Ir(acac) in CBP is fixed at 0.4 wt % and 0.35 wt %, and the concentration of Flrpic increases from 10 wt % to 16 wt %, the maximum current efficiency will increase to 13.1(cd/A) from 11.5(cd/A); while the maximum brightness will reach 13,400±400(cd/m2).

The drive voltage of white-light OLED of the present invention is approx. 4-5V. For white-light OLED of Example 14, the maximum current efficiency and energy efficiency is 14.7 (cd/A) and 7.1(cd/W), respectively, and the maximum brightness is 16,200(cd/m2). Comparatively, CIE color coordinate of Example 5 is a coordinate (0.34, 0.35) of white light.

Figure 14:
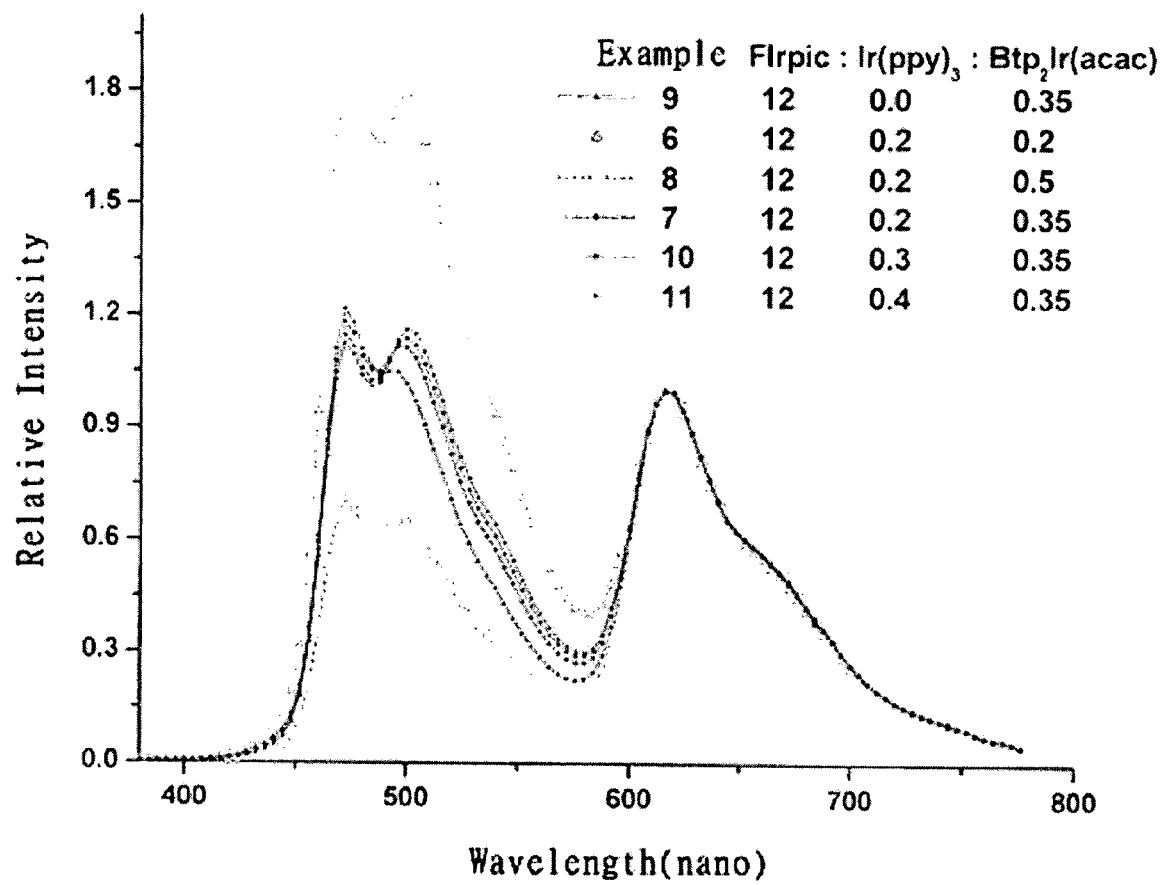
FIG. 14 shows a graphic illustration of the organic light-emitting spectrogram of white-light OLED in accordance with example 5-10 in the case of 7 v charging voltage.

FIG. 14 illustrates a spectrogram of 7-V white-light OLED of Examples 5-10. The white organic emitting spectrum is available with two peaks at 476-nano and 616-nano, i.e. characteristic peak of FIrpic and Btp2Ir(acac), and another peak at 496-nano. The wavelength of OLED covers a range from 380 to 776-nano. With the increasing concentration of Ir(ppy)3, FIrpic presents a growing light intensity in relation to Btp2Ir (acac). In addition, the red color of the peak will displace from 496-nano to 500-nano. This phenomenon is owing to the fact that more Ir(ppy)3 molecules are involved in organic light-emitting with the increasing concentration of Ir(ppy)3. In addition, when the concentration of Btp2Ir(acac) declines, the emission intensity of FIrpic and Ir(ppy)3 will increase, owing to growing energy transfer from substrate to FIrpic and Ir(ppy)3.

Figure 15:
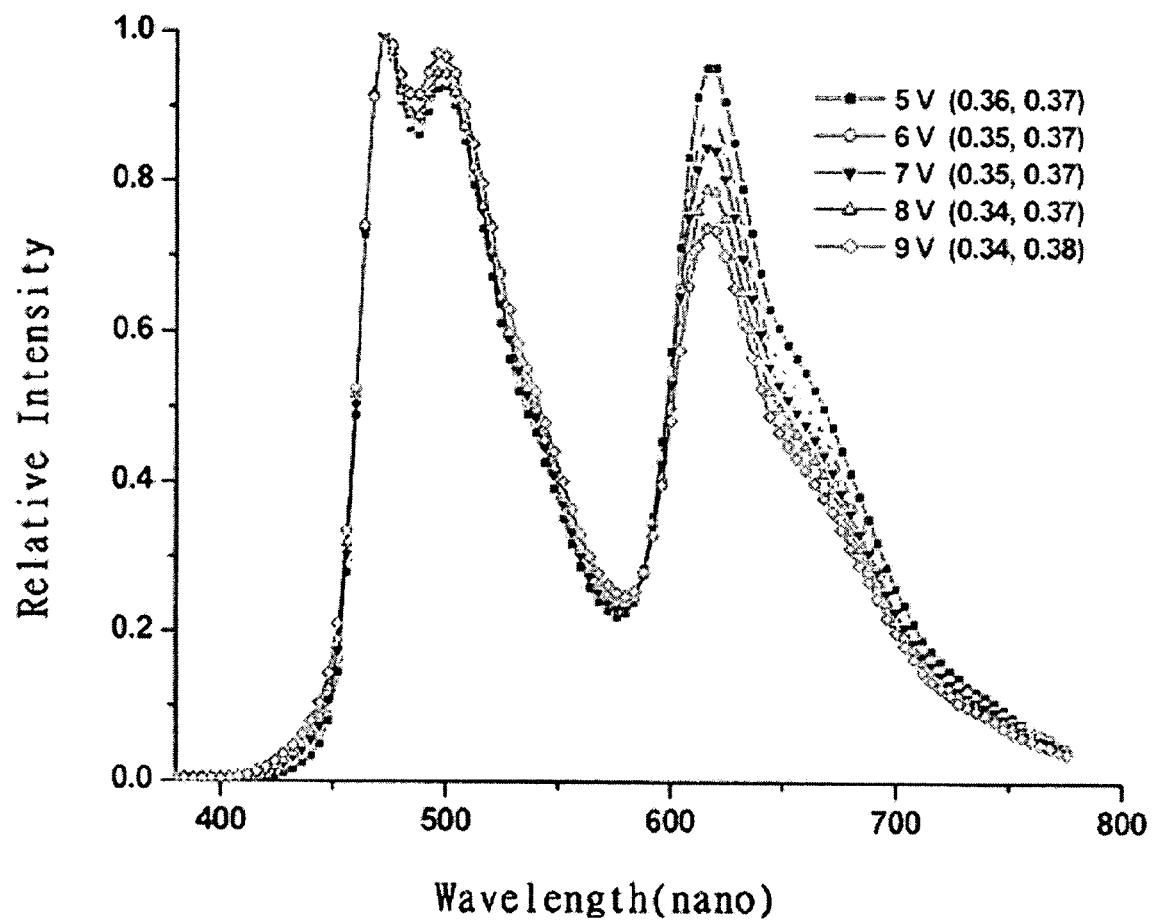
FIG. 15 shows another graphic illustration of the organic light-emitting spectrum of white-light OLED in accordance with example 7, which changes with the charging voltage.
Figure 16:
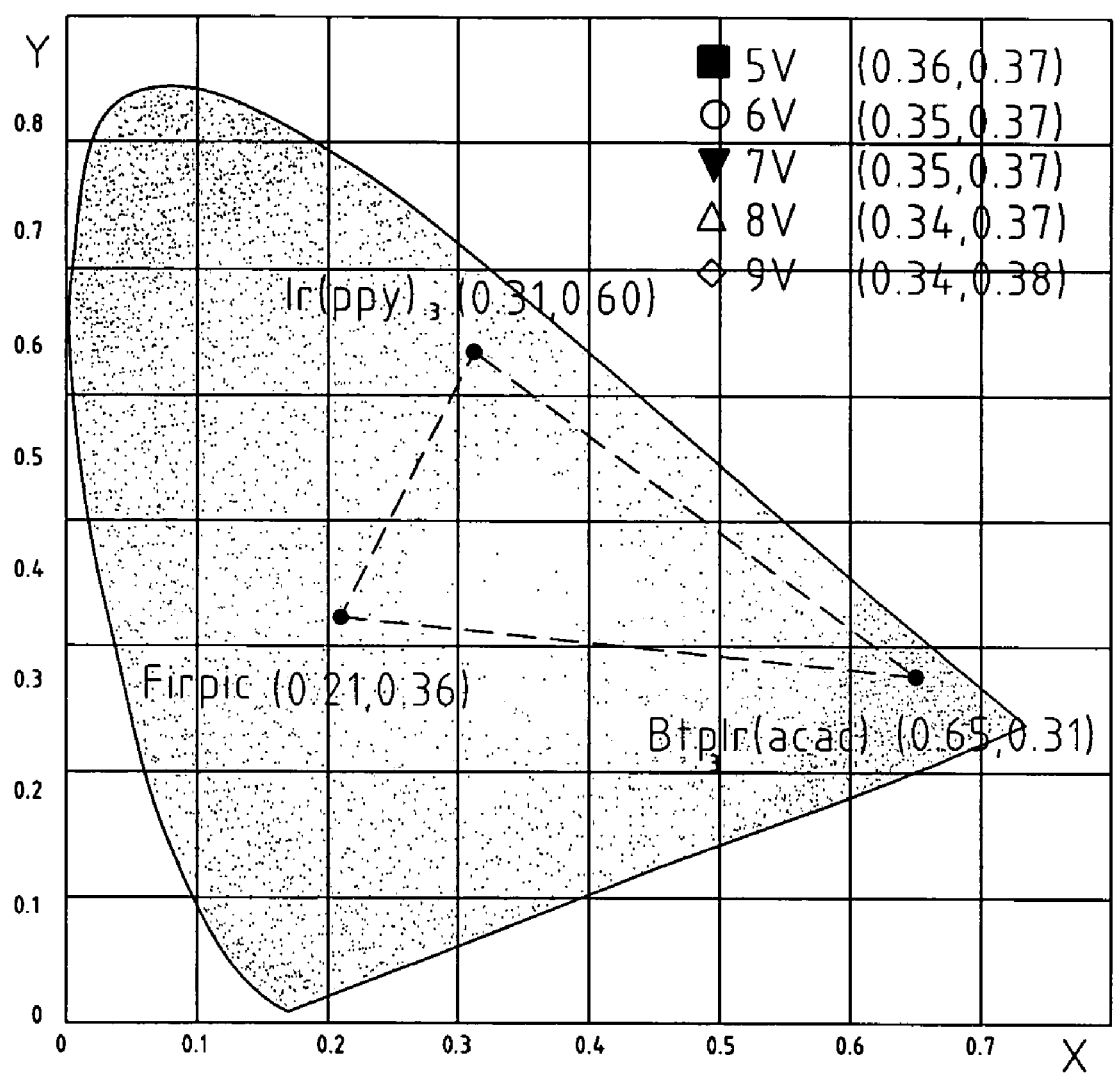
FIG. 16 shows a graphic illustration of the CIE color coordinate of white-light OLED in accordance with example 7, which changes with the charging voltage.

FIG. 15 illustrates a white-light OLED of Example 7, wherein organic light-emitting spectrum varies with the charging voltage. With the increase of charging voltage, the emission intensity of Btp2Ir(acac) shows a declining trend in relation to FIrpic and Ir(ppy)3, while organic light-emitting spectrum presents a slight blue displacement. FIG. 16 illustrates a white-light OLED of Example 7, wherein CIE color coordinate varies with the charging voltage. When the charging voltage of OLED varies from 5V to 9V, CIE color coordinates only shifts from (0.36, 0.37) to (0.34, 0.38), presenting an excellent photochromic stability.

EXAMPLE 19

As compared to aforesaid Examples, the white-light OLED of Example 19 lacks of a hole blocking layer BAlq3 between the white organic emitting layer and electron transport layer. As illustrated in FIG. 10, the structure comprises a substrate 1010; an anode 1020 formed on substrate 1010; a hole injection layer 1030 formed on anode 1020; a white organic emitting layer 1050 formed on hole injection layer 1030; an electron transport layer 1070 formed on white organic emitting layer 1050; an electron injection layer 1080 formed on electron transport layer 1070; and an cathode 1090 formed on electron injection layer 1080.

Figure 17:
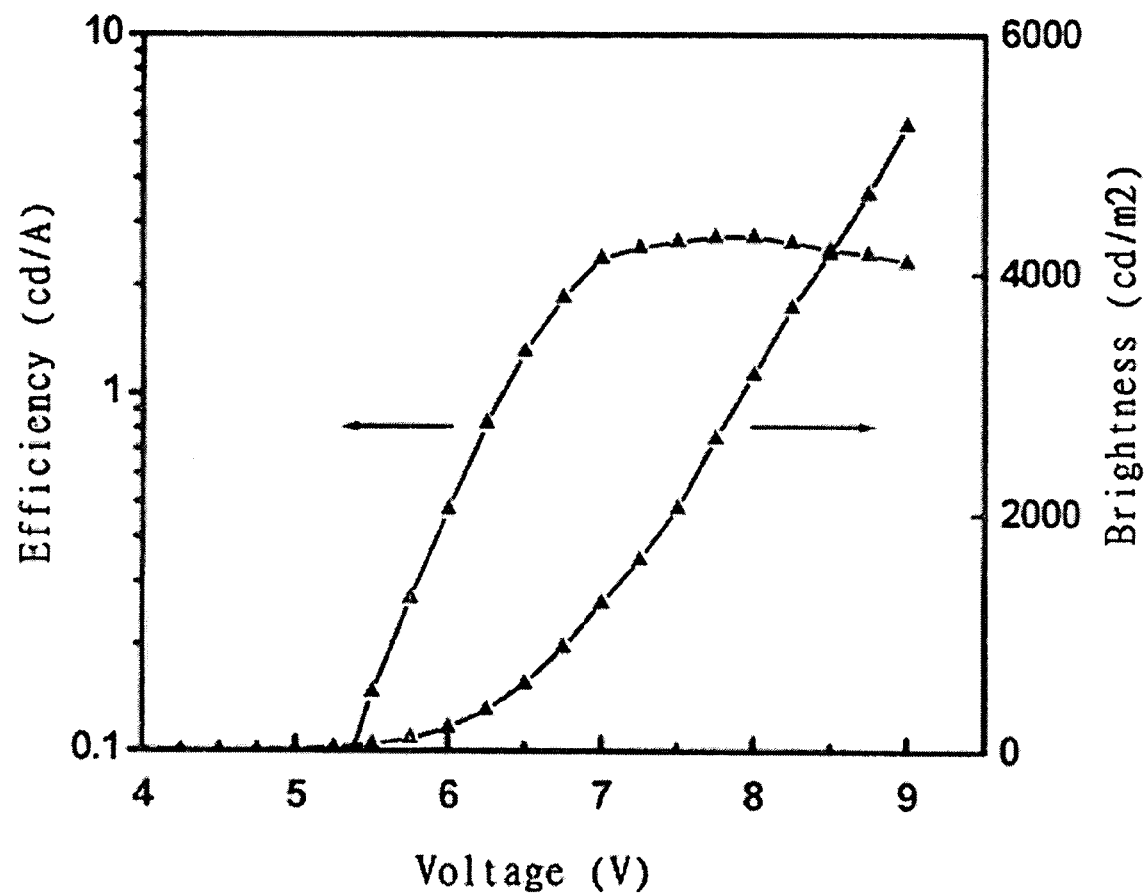
FIG. 17 shows a graphic illustration of the brightness-voltage-efficiency characteristics of white-light OLED in accordance with example 5.

FIG. 17 illustrates a brightness-voltage-efficiency characteristic diagram of a white-light OLED of Example 19. As illustrated in FIG. 21, the drive voltage, maximum current efficiency and maximum brightness of white-light OLED of Example 19 is 4.5(V), 2.8(cd/A) and 5,250(cd/m2), respectively.

Figure 18:
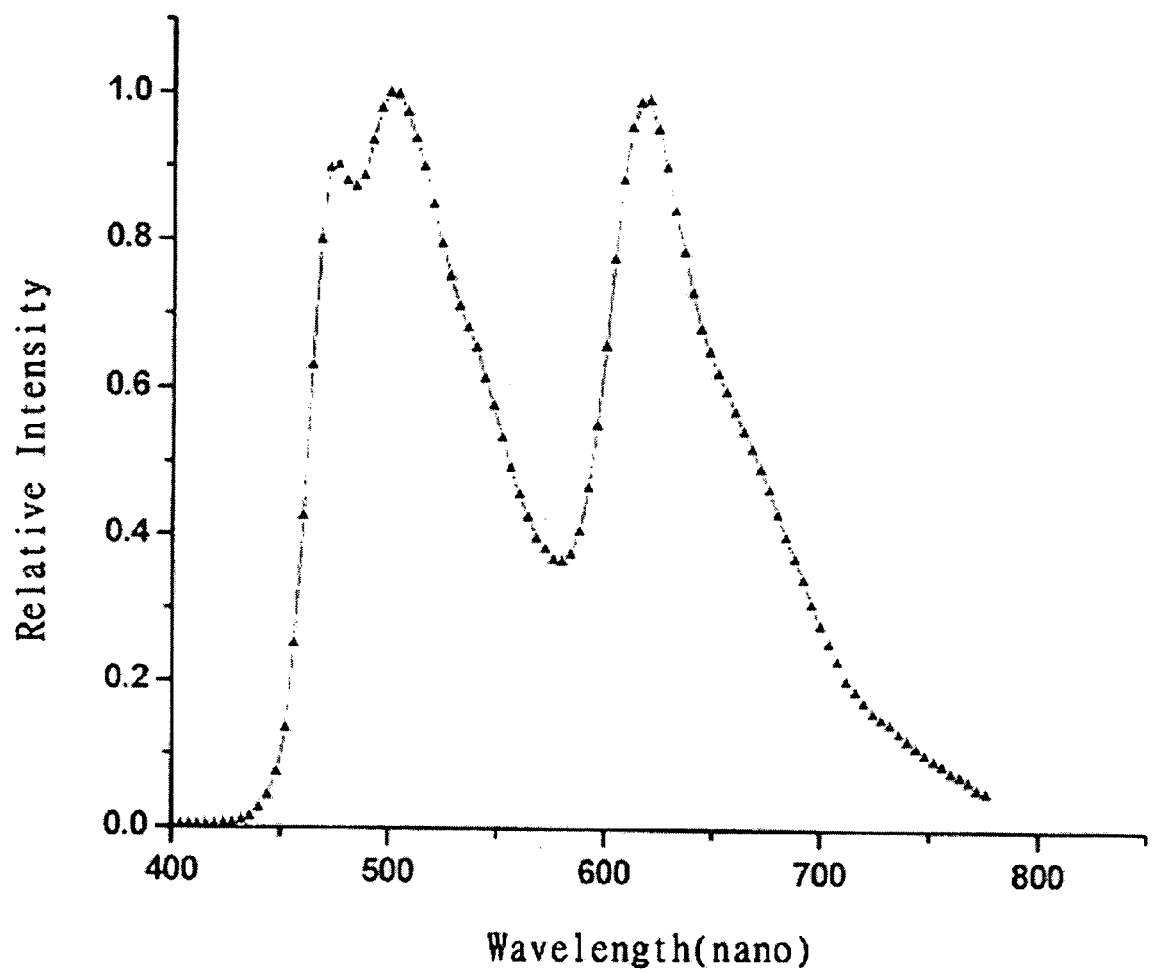
FIG. 18 shows a graphic illustration of the organic light-emitting spectrogram of white-light OLED in accordance with example 5 in the case of 7 v charging voltage.

FIG. 18 illustrates a spectrogram of 7-V white-light OLED of Example 19. The wavelength of OLED covers a range from 380 to 776-nano, where the emitting spectrum is available with two peaks at 476-nano and 616-nano, i.e. characteristic peak of FIrpic and Btp2Ir(acac), and another peak at 496-nano. The white CIE color coordinate is a coordinate of (0.35, 0.41).

Figure 19:
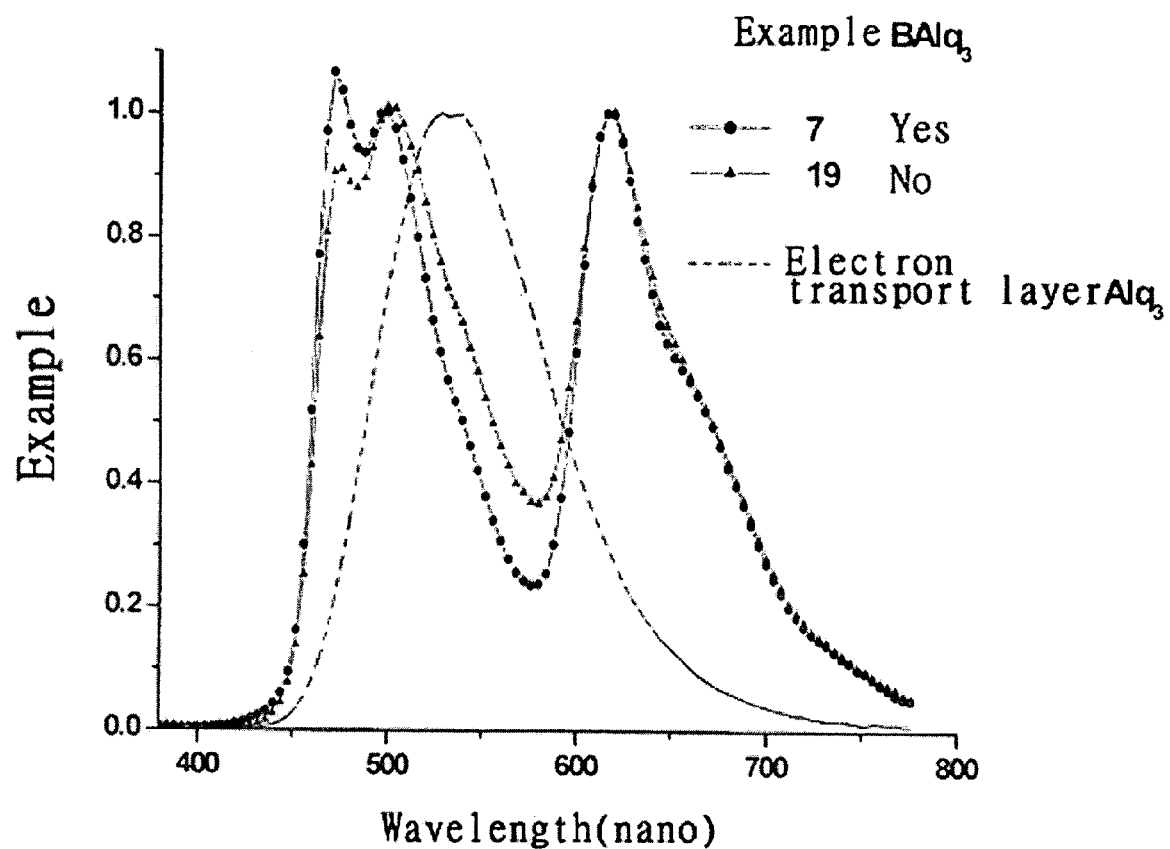
FIG. 19 shows a graphic illustration of the influence of the presence or otherwise of hole blocking layer balq3 upon light-emitting spectrum of white-light OLED of the present invention.

FIG. 19 illustrates the influence of presence or otherwise of hole blocking layer BAlq3 upon organic light-emitting spectrum of white-light OLED. For white-light OLED (Example 19) without hole blocking layer, there are three major peaks at 476, 500 and 620-nano, respectively. An additional organic light-emitting spectrum is observed in relation to a white-light OLED with hole blocking layer (Example 7). This is owing to the fact that electron carriers shift to electron transport layer Alq3, where overlapping is allowed to generate Alq3 emitting exciton and emit 528-nano green light. Moreover, some electron carriers shift to nearby the Alq3 layer, such that these electron carriers are limited into organic light-emitting layer of Ir light-emitting dyes, where there are less opportunities of forming emitting exciton than white-light OLED with hole blocking layer, thus affecting light color and efficiency of white-light OLED.

Figure 20:
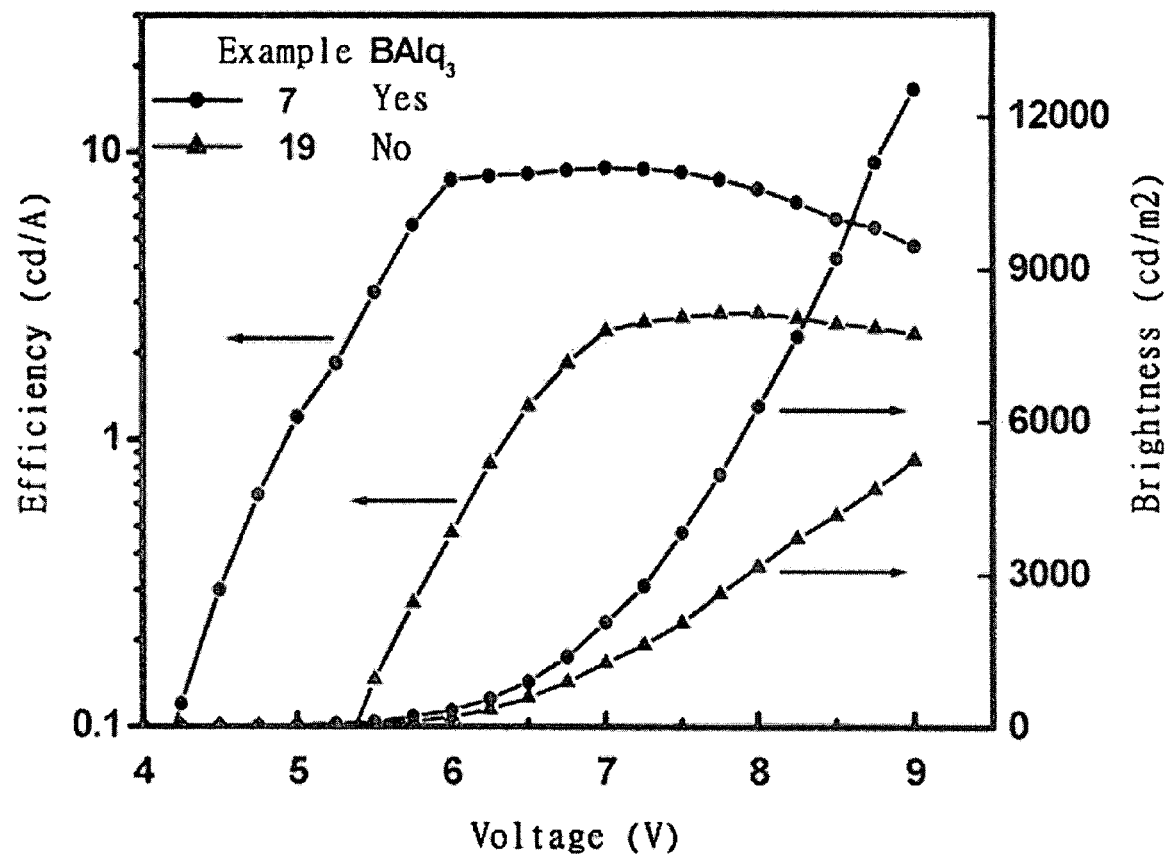
FIG. 20 shows a graphic illustration of the influence of the presence or otherwise of hole blocking layer balq3 upon brightness and efficiency of white-light OLED of the present invention.

For most of OLEDs, there are more hole carriers than electron carriers. Due to the unbalanced ratio of hole/electron, the excessive hole carriers cannot be efficiently applied for light-emitting. As such, the addition of hole blocking layer allows the excessive hole carriers to be limited effectively into white organic emitting layer, thus increasing the probability of overlapping with electron and improving the emitting efficiency. As illustrated in FIG. 20, the drive voltage, maximum brightness and emitting efficiency of OLED without hole blocking layer BAlq3 (Example 19) is [4.5(V), 2.8(cd/A) and 5,250(cd/m2)], respectively, whereas the drive voltage, maximum brightness and emitting efficiency of OLED with 15-nano hole blocking layer BAlq3 (Example 7) is [4(V), 8.8(cd/A) and 12,500(cd/m2)], respectively, presenting an improved emitting efficiency. In addition, OLED with hole blocking layer BAlq3 has a better photochromic stability than OLED without hole blocking layer. For example, when the charging voltage varies from 5V to 9V, CIE color coordinate of OLED without hole blocking layer (Example 19) will shift from (0.36, 0.40) to (0.34, 0.45), whereas that of OLED with hole blocking layer (Example 7) will only shift from (0.36, 0.37) to (0.34, 0.38). This phenomenon shows that hole blocking layer enables the charge carrier and triplet exciton to be properly limited in organic light-emitting layer, thus improving both emitting efficiency and photochromic stability of white-light OLED.

With a view to the emitting efficiency and light color of Examples 5, 11 and 16 that are not fabricated in the same batch, but available with the same structure and manufacturing parameters, white-light OLED fabricated by the solution manufacturing process presents excellent color rendering. Of which, the drive voltage, maximum brightness and emitting efficiency is 4.25±0.25(V), 14260±530(cd/m2) and 11.6±0.2 (cd/A), respectively; whereas the color of white light is kept at (0.34, 0.39), presenting excellent color rendering.

As defined in the aforesaid examples of the present invention, a white-light OLED with single emitting layer has been successfully developed using micro-molecular substrate via solution manufacturing process. This white-light OLED is characterized by simple manufacturing process, easily adjustable white light and high level of color rendering. The maximum emission brightness of white-light OLED of the present invention is up to 16,200(cd/m2); the maximum current efficiency and energy efficiency is 14.7(cd/A) and 7.1(cd/W); and CIE color coordinate is (0.34, 0.35). In the case of change of charging voltage, the light color of white-light OLED of the present invention only varies a little, presenting an outstanding photochromic stability.

White-light OLED and its fabrication method of the present invention exhibit the following advantages:
1. High-molecular substrate is replaced by micromolecular substrate, thus improving efficiently the emitting efficiency of white-light OLED;
2. White-light OLED of single emitting layer can improve efficiently the deviation of white light generated from the change of charging voltage;
3. As compared to vacuum evaporation method, the solution manufacturing process can provide a simpler manufacturing process, lower manufacturing cost and a wider range of applications for micromolecular white-light OLED, especially for the adjustment of white light color;
4. Micromolecular white-light OLED can be fabricated from two, three or more light-emitting dyes of different emitting spectrums and micromolecular substrates via solution manufacturing process;
5. Since there is no limitation on carriers and difficulty of simultaneous control of multiple concentration, the manufacturing process of the present invention can generate white light with better emitting efficiency and color rendering; and 6. The present invention can adjust easily and accurately the concentration of various light dyes with excellent color rendering.

The above is a detailed description of the technical features of the present invention based on a typical preferred embodiment. However, it should be appreciated that the present invention is capable of a variety of embodiments and various modifications by those skilled in the art, and all such variations or changes shall be embraced within the scope of the following claims.

We claim:

1. A white-light organic light-emitting diode comprising:
   a white organic emitting single layer having mixed organic light-emitting dyes of white light combinations into a micro-molecular substrate by a solution manufacturing process, said white organic emitting single layer being a single emissive layer;
   a first electrode having a hole transport layer positioned adjacent a first surface of said white organic emitting layer; and
   a second electrode having an electron transport layer positioned adjacent a second surface of said white organic emitting layer, said organic light-emitting dyes comprising a mixture of red dyes and green dyes and blue dyes, said red dyes being 0.01 to 10 weight percent of the layer, said blue dyes being 0.01 to 30 weight percent of the layer.

2. The white-light organic light-emitting diode of claim 1, said solution manufacturing process being a coating process.

3. The white-light organic light-emitting diode of claim 1, said solution manufacturing process being an ink-jet printing process.

4. The white-light organic light-emitting diode of claim 1, said solution manufacturing process being a screen printing process.

5. The white-light organic light-emitting diode of claim 1, said solution manufacturing process being a spin coating process.

6. The white-light organic light-emitting diode of claim 1, each of said first and second electrodes comprised of at least one electrode positioned adjacent a supporting substrate.

7. The white-light organic light-emitting diode of claim 6, said support substrate being transparent.

8. The white-light organic light-emitting diode of claim 6, said support substrate being non-transparent.

9. The white-light organic light-emitting diode of claim 6, said support substrate being flexible.

10. The white-light organic light-emitting diode of claim 6, said support substrate being non-flexible.

* * * * *